United States Patent [19]

Schreiber et al.

[11] Patent Number: 4,845,311

[45] Date of Patent: Jul. 4, 1989

[54] FLEXIBLE COAXIAL CABLE APPARATUS AND METHOD

[75] Inventors: Christopher M. Schreiber; Gerhard M. Badasch, both of Costa Mesa, Calif.

[73] Assignee: Hughes Aircraft Company, Los Angeles, Calif.

[21] Appl. No.: 222,442

[22] Filed: Jul. 21, 1988

[51] Int. Cl.[4] .............................................. H01B 7/34
[52] U.S. Cl. ........................................ 174/36; 29/828; 156/47; 156/55; 174/103; 174/104; 174/117 FF; 333/1; 333/243
[58] Field of Search ........... 174/36, 103, 104, 117 FF, 174/117 PC; 333/1, 161, 238, 243; 29/828; 156/47, 55

[56] References Cited

U.S. PATENT DOCUMENTS

| | | | |
|---|---|---|---|
| 3,004,229 | 10/1961 | Stearns | 333/84 |
| 3,568,000 | 3/1971 | D'Aboville | 333/238 X |
| 3,613,230 | 4/1969 | Griff | 29/828 |
| 4,475,006 | 10/1984 | Olyphant, Jr. | 174/36 |
| 4,572,926 | 2/1986 | Ganssle et al. | 174/103 |
| 4,662,968 | 5/1987 | Bleuel et al. | 156/250 |
| 4,673,904 | 6/1987 | Landis | 174/36 X |

Primary Examiner—Morris H. Nimmo
Attorney, Agent, or Firm—Joseph E. Szabo; Anthony W. Karambelas

[57] ABSTRACT

A flexible coaxial cable capable of high frequency signal propagation formed from a multilayer configuration having a plurality of adjacent signal traces etched in dielectric material and surrounded by a protective ground layer. Selected ones of the signal traces are designated to be conducting signal lines. A 360-degree signal return line is formed around each of the designated conducting signal traces utilizing signal traces adjacent those serving as conducting signal lines as part of the return line conductor. A 360-degree shield is also formed around the return line, again employing selected signal traces as part of the shield. The return line and shield are created using photo and laser etching, chemical milling and electroplating techniques. The cable allows electrical signal propagation in the gigahertz frequency range without appreciable signal loss and provides high density packaging. The flexible nature of the cable and its structure combine to provide an even variable standing wave ratio.

15 Claims, 4 Drawing Sheets

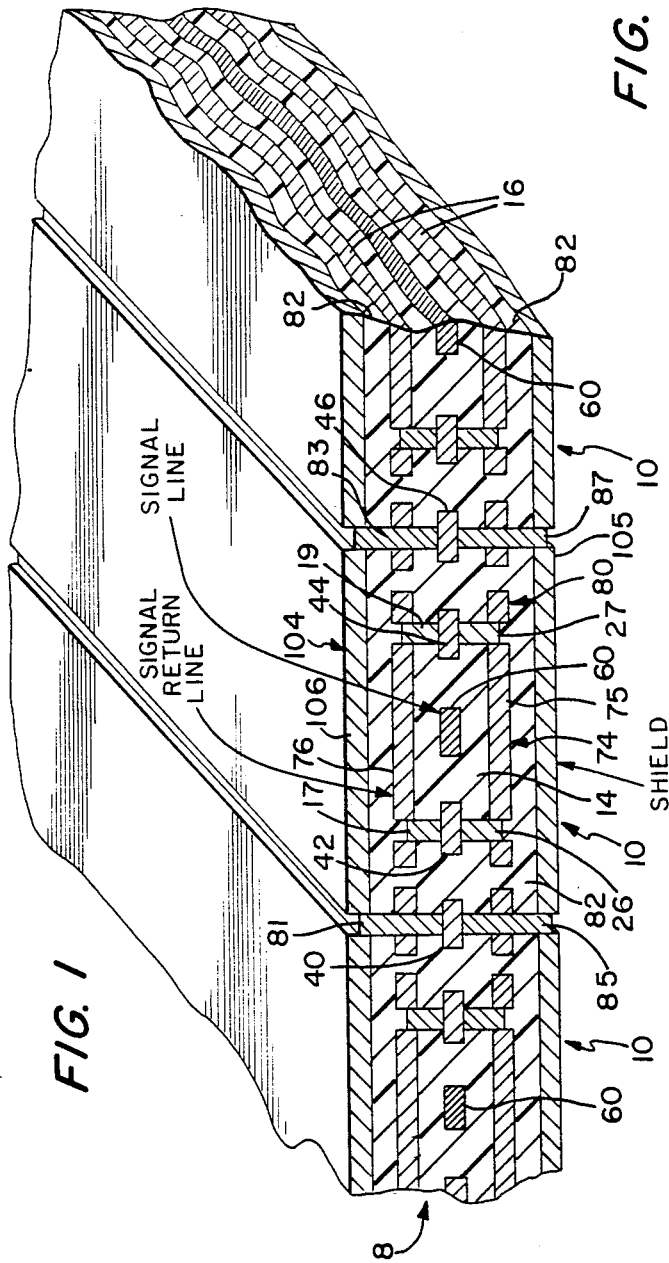

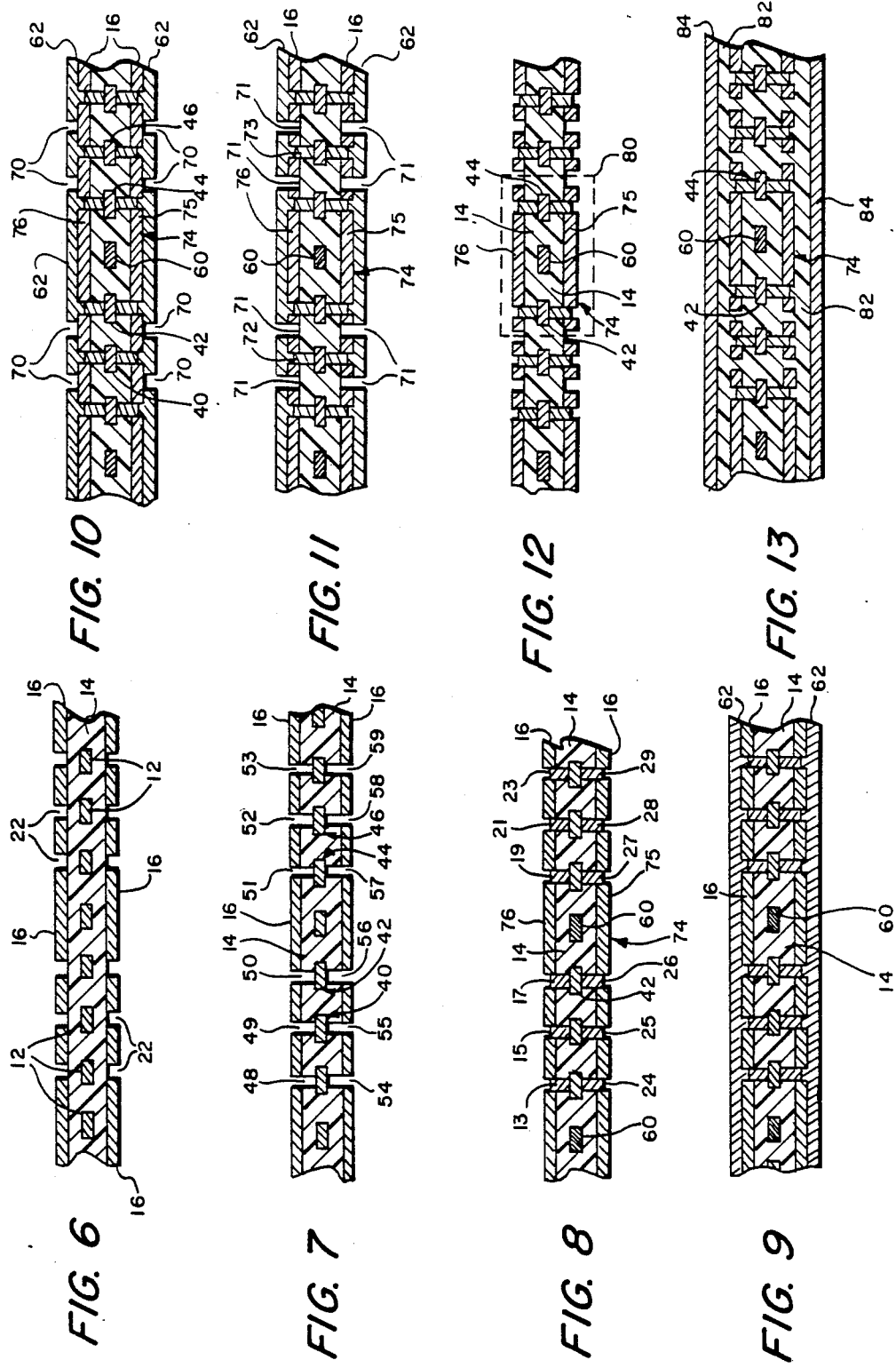

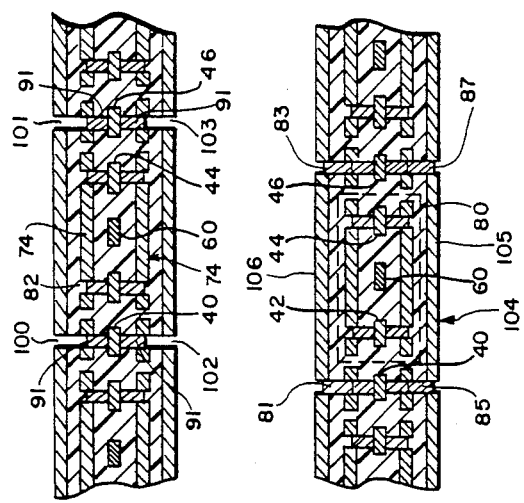
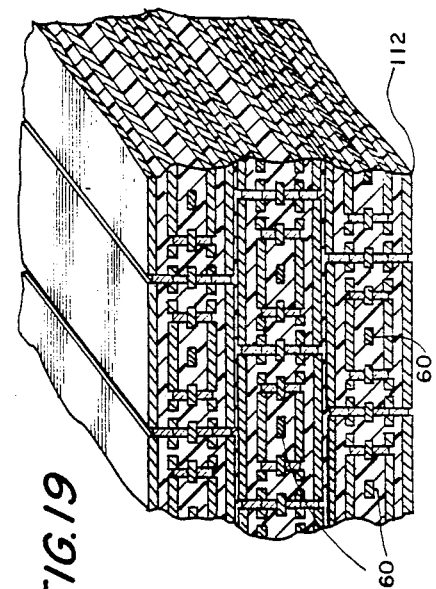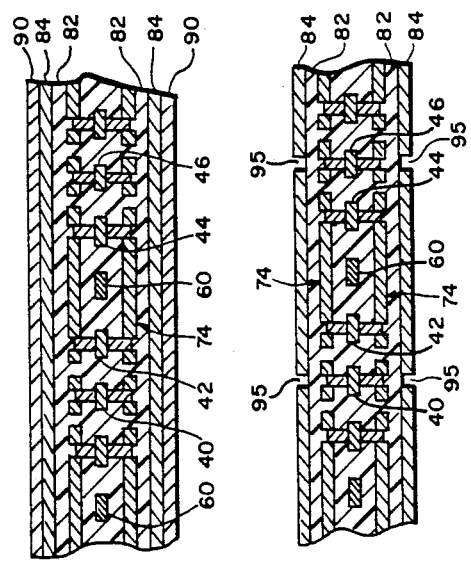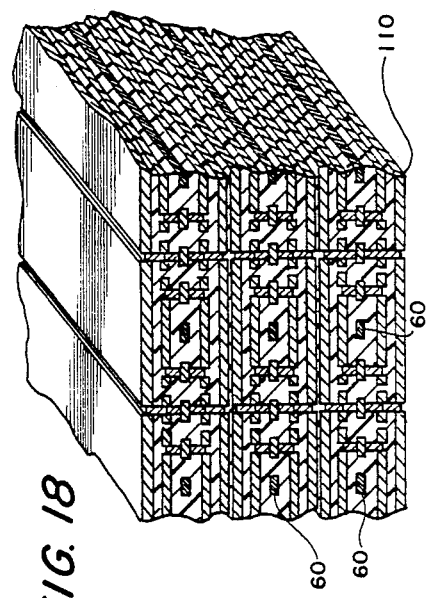

FLEXIBLE COAXIAL CABLE APPARATUS AND METHOD

BACKGROUND OF THE INVENTION

1. Field of the Invention

The present invention relates generally to signal transmission lines and, more specifically, to flexible coaxial cables capable of transmitting signals in the GHz frequency range without appreciable signal loss and providing high density packaging.

2. Description of the Prior Art

Advances in integrated circuits have increased their operating speeds into the gigahertz range, beyond the ability of commercially-available braided shielded cables to carry signals between them without significant radiation loss, which becomes significant at frequencies above 10 kHz. Moreover, when such cables are bent during connection, their variable standing wave ratio becomes uneven. One result of an uneven variable standing wave ratio is the dissipation of signal intensity due to signal mixing.

SUMMARY OF THE INVENTION

It is therefore an object of the invention to provide a cable or transmission line in which an electrical signal can propagate from one integrated circuit to another in the gigahertz frequency range without appreciable signal loss;

It is another object of the invention to provide high density packaging for such cables;

Yet another object of the invention is to provide a flexible cable which is less susceptible to transmission line losses which result from cable flexure; and A further object of the invention is to provide electrical signal propagation in a transmission cable with an even variable standing wave ratio.

According to the invention, a plurality of conducting signal lines is provided, each surrounded by dielectric material. A 360-degree signal return line is formed around each of the plurality of signal lines and a portion of the surrounding dielectric material, thereby forming a plurality of conjoined coaxial structures. Each of these coaxial structures is surrounded by additional isolating dielectric material and a 360-degree layer of conductive material for shielding each of the coaxial structures.

According to the preferred embodiment, the plurality of conducting signal lines may be conveniently selected from among adjacent signal traces in a multilayer structure. Others of the adjacent signal traces are selected to serve as elements of the 360-degree return and shield structures. The structure is preferably fabricated in a layered approach using known photo etching, chemical milling, laser ablading and electrolytic plating techniques. The continuous, flexible construction which results provides greatly improved operation over braided coaxial cable designs.

BRIEF DESCRIPTION OF THE DRAWINGS

The just-summarized invention will now be described in detail in conjunction with the drawings, of which:

FIG. 1 illustrates a cross-sectional perspective view of a flexible coaxial cable according to the preferred embodiment;

FIG. 2 illustrates a cross-sectional view of an initial multilayer configuration used in the fabrication process according to the preferred embodiment;

FIG. 3 through FIG. 16 illustrate cross-sectional views at successive stages in the fabrication of a flexible coaxial cable according to the preferred embodiment;

FIG. 17 illustrates a cross-sectional view of a flexible cable according to the preferred embodiment;

FIG. 18 illustrates a cross-sectional view of a first array of flexible coaxial cables according to the preferred embodiment; and FIG. 19 illustrates a cross-sectional view of a second array of flexible coaxial cables according to the preferred embodiment.

DESCRIPTION OF THE PREFERRED EMBODIMENT

Figure 3:
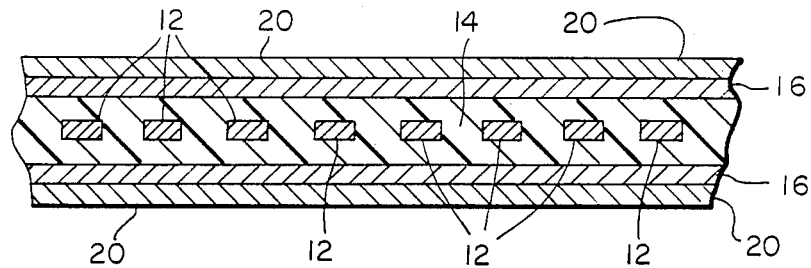

Referring to FIG. 1, a cross-sectional view is shown of a flexible cable 8 according to the preferred embodiment of the invention. The cable 8 comprises one or more flexible coaxial cables 10. Each of the coaxial cables 10 includes a central conducting signal line 60, surrounded by a first dielectric layer 14. A signal return line 74 is formed around the first dielectric layer 14. The signal return line 74 is surrounded by a second dielectric layer 82, which is in turn surrounded by a shield 104. The first dielectric layer 14 serves as an isolator between the conducting signal line 60 and the signal return line 74, while the second dielectric layer 82 serves as an insulator between the signal return line 74 and the shield 104. A preferred material for the dielectric layers 14, 82 is a polyimide dielectric, for example, the product sold under the mark "Kapton" by DuPont. Other dielectrics, of course, may be used.

The signal return line 74 is comprised of a plurality of conductor elements 75, 27, 44, 19, 76, 17, 42, 26, electrically connected in a substantially rectangular configuration. The lower planar conductor element 75 is electrically connected to a signal trace element 44 by a vertical conductor element 27. The signal trace 44 is connected via a second vertical conducting element 19 to the upper planar conductor element 76. A third vertical conductor element 17 electrically connects the upper planar element 76 to a signal trace 42. The fourth vertical conductor element 26 completes the conductive path by connecting the signal trace 42 to the lower planar conductor element 75.

Similarly, the shield 104 is comprised of a plurality of electrically connected conductor elements 105, 87, 46, 83, 106, 81, 40, 85. The bottom planar conductor element 105 is electrically connected through a first vertical conductor element 87 to a signal trace 46. Continuity between a top planar conductor element 105 and the signal trace 46 is established by a second vertical conductor element 83. The top planar conductor element 106 is electrically connected to a signal trace 40 by a third vertical conductor element 81. The signal trace 40 is electrically connected to the bottom planar conductor element 105 by a fourth vertical conductor element 85, thereby completing a substantially rectangular shield structure.

The central conducting signal line 60, the layer of dielectric 14 and the signal return line 74 combine to form a functional coaxial cable configuration 80. The protective shield 104 protects the signal which propagates in the coaxial cable configuration 80 from losses due to radiation out and from outside disturbances. Each shield 104 shares a common, substantially vertical conductor wall with the neighboring shield 104, thereby joining together each adjacent coaxial structure. In FIG. 1, such a wall comprises that formed by signal trace 40 and its adjacent vertical conductor elements 81, 82 and by signal trace 44 and its adjacent vertical conductor elements 83, 87.

The following description will disclose the preferred process of forming the cable 8. The structure and function of the apparatus of the preferred embodiment will be better understood as each step of its formation is discussed.

Referring to FIG. 2, a cross-section of a common multilayer configuration 11, well known in the art, is disclosed. This structure forms the foundation for fabrication of the cable 8. The common multilayer configuration 11 is comprised of signal traces 12 etched in cladding and sandwiched or encapsulated in dielectric material 14. The traces 12 may be, for example, 1.4 mils high by 5 mils wide and located on 10-mil centers.

An outer ground plane layer 16 is bonded to the dielectric material 14. The ground plane layer 16 may be fabricated of any good conductor, but is preferably a cladding of rolled annealed copper.

It will be observed that each central conducting signal line 60 starts out initially as a specific signal trace 12, as do the signal traces 42 and 44, which make up part of the signal return line 74, and the signal traces 40 and 46, which make up portions of the shield 104. A portion of the outer ground plane layer 16 will ultimately become a portion of each signal return line 74.

The multilayer configuration 11 is a foundational structure according to the preferred embodiment. The ensuing discussion of FIGS. 3-7 will illustrate the process steps designed to create vias in the multilayer configuration 11. These vias will ultimately be filled with conductive material to form elements of the signal return line 74 or the shield 104.

Referring to FIG. 3, the exposed surface of the outer ground plane 16 is coated with a photosensitive resist 20. The resist 20 may be laminated onto the ground plane 16 using a photoresist laminator, a device well known in the art. With a photoresist laminator, photoresist is rolled on using heat and pressure. The approximate temperature used in the heating process is 225°-250° F. A photoresist laminator can apply resist to a 24-inch wide segment at a rate of about two feet per minute.

Figure 4:
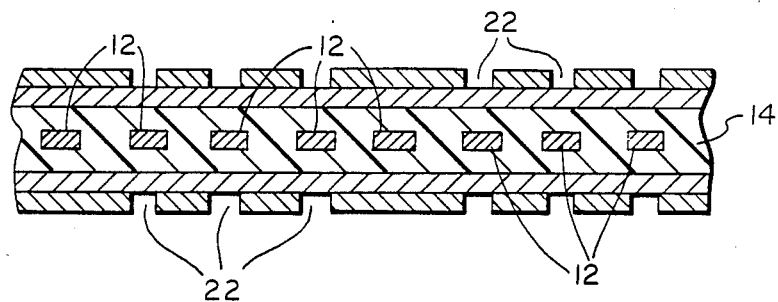

The applied photosensitive resist 20 is then exposed through a mask, thereby defining a desired pattern in an "exposure unit," a commercial well-known exposure device. The exposure unit (not shown) polymerizes the unmasked resist 20 by subjecting it to UV radiation. The resist 20 is then developed. A conveyorized developer of the type commercially known is suitable. The developer solution removes the unpolymerized resist (the resist which was unexposed because it was masked). Referring to FIG. 4, the removed resist leaves gaps 22, which are in alignment with selected ones of the signal traces 12.

An alternate method of defining a desired pattern would be to print the pattern using a silk screen and an alkali soluble etch resist. This alternative would eliminate the resist lamination, exposure and developing processes.

Figure 5:
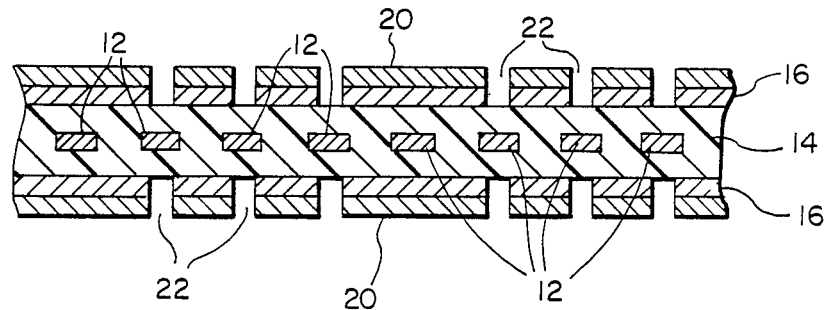

Referring to FIG. 5, portions of the copper outer ground plane 16 are chemically milled (or etched) away to create openings in alignment with the gaps 22. The remaining photoresist 20 is used to define a pattern for the chemical milling (or etching) process. Conveyorized etchers may be used in the chemical milling process. Etchants which may be used in the process include cupric chloride, sulfuric peroxide, ammonium hydroxide, ammonium peroxide, ferric chloride (except as regulated by the EPA), etc. Subsequent to chemically milling, a conveyorized stripping machine strips the remaining resist and cleans, rinses and dries the device.

After stripping, the remaining outer ground plane 16 acts as a mask so that portions of the dielectric material 14 can be removed with a laser. The laser is used to selectively ablade the dielectric 14, creating vias 48-59, shown in FIG. 7. Certain of these vias, 49, 50, 51, 52, 55, 56, 57, 58, lead to selected signal traces 40, 42, 44, 46, as demonstrated in FIG. 7. As mentioned, these signal traces 40, 42, 44, 46 will ultimately respectively form part of the shield 104, the signal return line 74, the signal return line 74, and the shield 104, for one coaxial cable 10.

Having cleared away desired portions of the dielectric 14 and ground plane 16, the vias 48, 49, 50, 51, 52, 53, 54, 55, 56, 57, 58, 59, as shown in FIG. 7, are ready to be filled with conductive material, which is accomplished as shown in FIG. 8.

Referring to FIG. 8, after cleaning the vias (48-59 of FIG. 7), they are electrolytically plated during a first metal deposition process. In this first metal deposition process each via 48, 49, 50, 51, 52, 53, 54, 55, 56, 57, 58, 59 is filled with conductive material to create respective vertical conducting elements 13, 15, 17, 19, 21, 23, 24, 25, 26, 27, 28, 29.

The electrolytic plating process used to create the conducting elements 13, 15, 17, 19, 21, 23, 24, 25, 26, 27, 28, 29 may consist of a metal deposition wherein a high-level RF or DC current is applied to a metal within a vacuum. The metal is preferably copper or another favorably conductive metal. An alternative method of creating the conducting elements 13, 15, 17, 19, 21, 22, 23, 24, 25, 26, 27, 28, 29 would be to screen one a conductive epoxy.

The electrolytic plating of vias 50, 51, 56 and 57 creates a 360-degree signal return line 74 around a specific inner signal trace 60, as shown in FIG. 8. Starting at signal trace 42 and moving counterclockwise, the 360-degree signal return 74 is comprised of the signal trace 42, a vertical conducting element 26, a lower planar conductor element 75, a vertical conducting element 27, a signal trace 44, a vertical conducting element 19, an upper planar conductor element 76 and a vertical conducting element 17. The width of the vertical conductor elements 17, 19, 26, 27 and thickness of the planar conductor elements 75, 76 may.be the same as the height of the center conductors 60, e.g., 1.4 mils.

The 360-degree signal returns 74 are next isolated from one another. The steps used to produce this isolation are illustrated in FIGS. 9-12.

Referring to FIG. 9, an additional layer of photosensitive resist 62 is applied to the structure shown in FIG. 8. The resist 62 is laminated on by the same lamination process described in connection with FIG. 3. The photosensitive resist 62 is selectively exposed through a mask to define a desired pattern. Next, the unexposed resist is removed by the developer solution of the conveyorized developer, in the same procedure as previously described. The removal of this portion of the resist bares the outer ground plane 16 in selected places 70, as shown in FIG. 10.

Referring to FIG. 11, the outer ground plane 16 is chemically milled away at the selected places 70 in the photoresist 62, thereby baring certain portions 71 of the dielectric material 14. At the completion of this step, the coaxial cable configuration comprised of the coaxial signal return 74 and the signal trace 60 is electrically isolated from adjacent cables about a full 360 degrees.

Referring to FIG. 12, the photoresist layer 62 is removed from the structure illustrated in FIG. 11. FIG. 12 illustrates that the coaxial signal return line 74 includes the two portions 75, 76 which are formed from what has been referred to as the outer ground plane 16. The specific signal trace 60 is the desired signal carrier. The specific signal trace 60 is embedded in dielectric material 14 which, in turn, is embedded in the rectangular-shaped coaxial signal return line 74. The rectangular signal return line 74, the dielectric 14, and the signal trace 60 combine to make a rectangular coaxial cable configuration 80. An indefinite number of these rectangular coaxial cable configurations 80 may be fabricated side by side to produce a device very similar to a ribbon cable.

At this point a functional coaxial cable has been described. The coaxial cable configurations 80 are next shielded to protect them from transmission loss caused by radiation out or susceptibility to outside disturbances, as will be discussed in connection with FIGS. 13–17.

Referring to FIG. 13, a layer of dielectric 82 is laminated, deposited, or otherwise applied to the device of FIG. 12. Additionally, another layer of conductor or clad 84 is laminated, deposited, or otherwise applied on top of the additional dielectric layer 82. The additional layer of clad 84 will ultimately be used as part of the shield 104. The additional layer of clad 84 may be applied by vacuum deposition.

Referring to FIG. 14, a layer of photosensitive resist 90 is laminated onto the structure shown in FIG. 13 using a lamination process like that used to apply the photoresist layer 20 of FIG. 3. The photoresist 90 is selectively exposed and developed. The undeveloped resist is removed from selected areas where the additional layer of clad 84 is chemically milled away. The chemical milling process is the same as that described with reference to FIG. 7.

Referring to FIG. 15, the photoresist 90 is removed after it has served as a mask for the chemical milling of the additional clad layer 84. The clad layer 84 is illustrated with specific portions removed to create openings 95 as a result of the chemical milling process. The openings 95 are in vertical alignment with the signal traces 40 and 46.

The remaining portions of the additional clad layer 84 function as a laser mask. Laser radiation is used to vertically penetrate the openings 95 in the clad layer 84 and remove the dielectric material 82 in selected areas, until material 91 conductively connected to signal traces 40 and 46 is bared. The voids created by the removal of the dielectric 82 are designated as vias 100–103, shown in FIG. 16. These vias 100–103 are cleaned after removal of the dielectric material.

Referring to FIG. 17, vias 100–103 are filled with conductive material to form conductor elements 81, 83, 85, 87 by an electrolytic plating process. These elements 81, 83, 85, 87 provide conductive continuity between the clad 84 and the signal traces 40 and 46, forming a rectangular shield 104 around the cable configuration 80. The electrolytic plating process may be the same process described with reference to FIG. 8. The shield 104 is composed of the following components, proceeding counterclockwise from signal trace 40: vertical conductor element 85, a bottom planar conductor element 105, vertical conductor element 87, a signal trace 46, a vertical conductor element 83, a top planar conductor element 106, and a vertical conductor element 81, which completes the 360-degree electrical connection to signal trace 40. Again, the width of the vertical conductor elements 81, 83, 85, 87 and the thickness of the planar conductor elements 105, 106 may be the same as the height of the center conductors 60, e.g., 1.4 mils.

In addition to the creation of one cable 10, and as mentioned above, a plurality of cables 10 may be created side by side to form a composite cable 8, much like a ribbon cable. Also, cables 10 according to the preferred embodiment may be placed on top of one another and epoxied together. The individual cables 10 may be aligned in vertical columns to produce a flexible cable array 110, as shown in FIG. 18, or the respective cables 10 may be offset from one another to form the flexible array 112 shown in FIG. 19. Arrays 110 and 112 promote high density packaging and offer the same advantage of gigahertz frequency range operation offered by the individual flexible coaxial cables 10.

The just-disclosed preferred embodiment has numerous features and advantages. The flexibility and continuously solid construction of the signal return line, as opposed to the braided construction of the prior art, are responsible for producing an even variable standing wave ratio when the cable is bent and for deterring signal mixing. The solid construction and flexibility also decrease signal loss due to radiation out. Combining these features with the protective shield provides protection from susceptibility to external radiation. The result is high frequency signal transmission in the gigahertz range with no appreciable loss.

Also significant is the high density in which the coaxial cables can be produced. The side by side arrangement and the relatively small size of each cable gives rise to a high density packaging capability. In addition, layers of the cable, fabricated in much the same arrangement as a ribbon cable, can be placed one on top of another and combined with epoxy or other adhesive to produce an even greater high density packaging capability.

The described embodiment is but one illustration of the present invention. Other analogous and equivalent methods of manufacture and functionally equivalent devices will be apparent to one skilled in the art from the subject disclosure. For example, the rectangular configuration disclosed is provided for ease of manufacture. The cable could also comprise various other shapes such as a circular or elliptical configuration.

Thus, many modifications and adaptations of the preferred embodiment can be made without departing from the scope and spirit of the invention. Therefore, it is to be understood that, within the scope of the appended claims, the invention may be practiced other than as specifically described herein.

What is claimed is:

1. A method of producing a cable for electrical signal propagation, comprising the steps of:
providing a multilayer conductor configuration, at least a first layer comprising a plurality of laterally spaced apart conducting signal traces, each surrounded by dielectric material, at least one other layer comprising a protective electrical shield for said first layer;

forming a 360-degree signal return line around each of a selected first set of said conducting signal traces and surrounding dielectric material, thereby forming a plurality of coaxial structures;

isolating each of the plurality of coaxial structures and surrounding each of them in an additional layer of dielectric material; and surrounding each additional layer of dielectric material with a 360-degree conductive shield for shielding each coaxial structure.

2. The method of claim 1 wherein, in said step of forming a 360-degree signal return line, a selected second set of said signal traces are used to form part of the signal return line.

3. The method of claim 2 wherein, in said step of surrounding each additional layer of dielectric material, a selected third set of said signal traces are used to form part of said conductive shield.

4. A method of forming a coaxial cable, comprising the steps of:

providing a multilayer configuration comprised of an inner layer of adjacent signal traces which are formed in a layer of dielectric material, said layer of dielectric material being sandwiched between a pair of outer ground plane layers;

removing portions of the outer ground plane layers and dielectric material to expose a first, second, third and fourth of said adjacent signal traces, while leaving covered a fifth of said adjacent signal traces, said second and third signal traces lying between said first and fourth signal traces, and said fifth signal trace forming a conducting signal trace lying between said second and third signal traces;

forming a 360-degree signal return line by connecting said second and third signal traces to said outer ground plane layers to produce a 360-degree conductive enclosure around said conducting signal trace whereby said conducting signal trace is isolated from its 360-degree signal return line by a layer of said dielectric material; and shielding said 360-degree signal return line, said shielding step comprising connecting said first and fourth signal traces to an additional conductive layer.

5. The method of claim 4 wherein the removing step comprises:

applying photosensitive resist to said multilayer configuration;

exposing the photosensitive resist in predetermined areas;

developing the exposed photosensitive resist in said predetermined areas;

removing the undeveloped photosensitive resist;

removing portions of the outer ground plane layers in areas not having developed photosensitive resist thereon; and removing dielectric material from areas in vertical alignment with said removed portions of the outer ground planes.

6. The method of claim 5 wherein the step of removing portions of said outer ground plane layers comprises the step of chemically milling away the outer ground plane layers in selected areas.

7. The method of claim 5 wherein the step of removing dielectric material comprises using a laser to remove said dielectric material.

8. The method of claim 4 wherein the step of forming a 360-degree signal return line includes the step of:

depositing metal onto said second and third exposed signal traces such that both of said second and third signal traces are conductively connected to the outer ground plane layers.

9. The method of claim 4 wherein the shielding step comprises the steps of:

adding a pair of additional layers of dielectric material and sandwiching said 360-degree signal return line between them;

adding an additional layer of conductive material to each said additional layer of dielectric material;

removing portions of each said additional layer of dielectric material and each said additional layer of conductive material to create openings in alignment with said first and fourth signal traces; and depositing a conductive substance into said openings such that both of said first and fourth signal traces are conductively connected to the additional layer of conductive material.

10. The method of claim 9 wherein the step of removing portions of the additional layers of dialectric material and additional layers of conductive material comprises the steps of:

applying photosensitive resist to the additional layers of conductive material;

exposing, polymerizing and developing specified portions of said photoresist in alignment with said first and fourth signal traces;

removing undeveloped photosensitive resist;

removing portions of the additional layers of conductive material in alignment with said first and fourth signal traces;

removing portions of the dielectric material in alignment with said first and fourth signal traces; and depositing conductive material in place of the removed dielectric material and the removed additional conductive layer to create a conductive connection between said first and fourth signal traces and the additional conductive layers.

11. The method of claim 11 wherein the step of removing portions of the additional conductive layers includes etching away those portions.

12. The method of claim 11 wherein the step of removing dielectric material comprises the step of subjecting the dielectric material to a laser beam using the openings in the additional layers of conductive material as a laser mask.

13. A cable for propagating electrical signals, comprising:

a plurality of means for conducting an electrical signal, each electrical signal conducting means being surrounded by dielectric material;

a plurality of signal return conductor means each surrounding a respective one of said electrical signal conducting means and being spaced apart therefrom by said dielectric material;

a layer of dielectric material surrounding each said signal return conductor means; and means surrounding each said layer of dielectric material for shielding each of said signal return conductor means, said shielding means including shared conductor means joining adjacent ones of said layers of dielectric material to form a unitary cable of said plurality of electrical signal conducting means and their surrounding signal return conductor means.

14. A cable for propagating electrical signals, comprising:
- a plurality of means for conducting an electrical signal, each electrical signal conducting means being surrounded by dielectric material;
- a plurality of signal return conductor means each surrounding a respective one of said electrical signal conducting means and being spaced apart therefrom by said dielectric material, each said signal return conductor means comprising:
- a lower planar conductor element;
- a first vertical conductor element connected to the lower planar conducting element;
- a first signal trace connected to said first vertical conductor element;
- an upper planar conductor element;
- a second vertical conductor element connecting said upper planar conductor element to the first signal trace;
- a second signal trace;
- a third vertical conductor element electrically connecting the upper planar conductor element to said second signal trace; and
- a fourth vertical conductor element electrically connecting the second signal trace to the lower planar conductor element;
- a layer of dielectric material surrounding each said signal return conductor means; and
- means surrounding each said layer of dielectric material for shielding each of said signal return conductor means.

15. A cable for propagating electrical signals, comprising:
- a plurality of means for conducting an electrical signal, each electrical signal conducting means being surrounded by dielectric material;
- a plurality of signal return conductor means each surrounding a respective one of said electrical signal conducting means and being spaced apart therefrom by said dielectric material;
- a layer of dielectric material surrounding each said signal return conductor means; and
- means surrounding each said layer of dielectric material for surrounding each of said signal return conductor means, said means for shielding comprising:
- a bottom planar conductor element;
- a third signal trace;
- a first vertical shield conductor element electrically connecting the bottom planar conductor element to the third signal trace;
- a top planar conductor element;
- a second vertical shield conductor element electrically connecting the top planar conductor element to the third signal trace;
- a fourth signal trace;
- a third vertical conductor element electrically connecting the top planar conductor to the fourth signal trace; and
- a fourth vertical conductor element electrically connecting the fourth signal trace to the bottom planar conductor element.

* * * * *